(12) United States Patent
Eguchi et al.

(10) Patent No.: US 9,048,107 B2
(45) Date of Patent: Jun. 2, 2015

(54) SEMICONDUCTOR DEVICE

(75) Inventors: Hiroomi Eguchi, Seto (JP); Atsushi Onogi, Toyota (JP); Takashi Okawa, Toyota (JP); Kiyoharu Hayakawa, Obu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 128 days.

(21) Appl. No.: 13/876,170

(22) PCT Filed: Sep. 26, 2011

(86) PCT No.: PCT/IB2011/002361
§ 371 (c)(1),
(2), (4) Date: Mar. 27, 2013

(87) PCT Pub. No.: WO2012/042370
PCT Pub. Date: Apr. 5, 2012

(65) Prior Publication Data
US 2013/0181252 A1    Jul. 18, 2013

(30) Foreign Application Priority Data

Sep. 30, 2010   (JP) ................. 2010-221534

(51) Int. Cl.
| | |
|---|---|
| H01L 29/06 | (2006.01) |
| H01L 27/06 | (2006.01) |
| H01L 29/08 | (2006.01) |
| H01L 29/739 | (2006.01) |
| H01L 29/861 | (2006.01) |
| H01L 29/16 | (2006.01) |
| H01L 29/20 | (2006.01) |

(52) U.S. Cl.
CPC ........ H01L 29/0611 (2013.01); H01L 27/0676 (2013.01); H01L 29/0696 (2013.01);
(Continued)

(58) Field of Classification Search
CPC ......... H01L 29/06; H01L 29/00; H01L 29/76; H01L 31/062; H01L 29/94; H01L 27/12
USPC ......... 257/109, 288, 133, 139, 141, 342, 343, 257/347, 393, 368, 622, 151–155, 328–331, 257/268
See application file for complete search history.

(56) References Cited

U.S. PATENT DOCUMENTS

| | | | |
|---|---|---|---|
| 5,554,872 | A | 9/1996 | Baba et al. |
| 6,133,591 | A | 10/2000 | Letavic et al. |

(Continued)

FOREIGN PATENT DOCUMENTS

| | | |
|---|---|---|
| JP | 10-200102 | 7/1998 |
| JP | 2002-521822 | 7/2002 |

(Continued)

OTHER PUBLICATIONS

Applicant's Response to the Written Opinion in International Application No. PCT/IB2011/002361 (Apr. 19, 2012).

*Primary Examiner* — Chuong A Luu
(74) *Attorney, Agent, or Firm* — Finnegan, Henderson, Farabow, Garrett & Dunner, LLP

(57) ABSTRACT

A semiconductor device includes a semiconductor layer; a first type of a first semiconductor element that is arranged in a first element region of the semiconductor layer, has first and second main electrodes, and switches current; and a second type of a second semiconductor element that is arranged in a second element region of the semiconductor layer, has third and fourth main electrodes, and freewheels the current. The first and second element regions are adjacent in a direction orthogonal to a direction in which current flows, and are formed in a loop shape over the entire element region when the semiconductor layer is viewed from above. The first main electrode is electrically connected to the third main electrode, and the second main electrode is electrically connected to the fourth main electrode. When the semiconductor layer is viewed from above, a ratio of a length of the first main electrode to a length of the second main electrode is larger than a ratio of a length of the third main electrode to a length of the fourth main electrode.

9 Claims, 14 Drawing Sheets

(52) U.S. Cl.
CPC ........ *H01L29/0834* (2013.01); *H01L 29/7394* (2013.01); *H01L 29/861* (2013.01); *H01L 29/1608* (2013.01); *H01L 29/20* (2013.01); *H01L 29/2003* (2013.01)

(56) References Cited

U.S. PATENT DOCUMENTS 6,236,068 B1  5/2001  Feiler

| 2002/0053717 | A1  | 5/2002  | Sumida |
|---|---|---|---|
| 2002/0070412 | A1* | 6/2002  | Mitlehner et al. ............ 257/401 |
| 2003/0001209 | A1* | 1/2003  | John et al. ...................... 257/350 |
| 2007/0096174 | A1  | 5/2007  | Higuchi |

FOREIGN PATENT DOCUMENTS

| JP | 2005-64472  | 3/2005  |
|---|---|---|
| JP | 2006-344779 | 12/2006 |
| JP | 2011-61051  | 3/2011  |

\* cited by examiner

SEMICONDUCTOR DEVICE

CROSS-REFERENCE TO RELATED APPLICATIONS

This application is a national phase application of International Application No. PCT/IB2011/002361, filed Sep. 26, 2011, and claims the priority of Japanese Application No. 2010-221534, filed Sep. 30, 2010, the content of both of which is incorporated herein by reference.

BACKGROUND OF THE INVENTION

1. Field of the Invention

The invention relates to a semiconductor device, and more particularly, to a semiconductor device in which different types of semiconductor elements are provided on a single semiconductor layer.

2. Description of Related Art

In recent years, semiconductor devices in which a semiconductor element for switching and a semiconductor device for freewheeling current are provided on a single semiconductor layer have been developed. For example, an inverter circuit that converts direct current (DC) power to alternating current (AC) power is formed by connecting a plurality of these types of semiconductor devices together.

Japanese Patent Application Publication No. 2005-64472 (JP-A-2005-64472) describes one example of a semiconductor device used in an inverter circuit. In this semiconductor device, a Lateral IGBT (Lateral Insulated Gate Bipolar Transistor; hereinafter referred to as "LIGBT") and a Free Wheeling Diode (hereinafter referred to as "FWD") are provided on a single Semiconductor on Insulator (SOI) substrate.

FIGS. 11 and 12 are views of the general structure of the semiconductor device described in JP-A-2005-64472. FIG. 11 is a plan layout of the semiconductor device, and FIG. 12 is a sectional view taken along line XI-XI in FIG. 11. As shown in FIGS. 11 and 12, a trench insulation separating portion is provided on a semiconductor layer of the SOI substrate. A portion of the semiconductor layer is divided into two element regions by this trench insulation separating portion. The LIGBT is arranged in one element region, and the FWD is arranged in the other element region.

As shown in FIG. 11, the LIGBT has a structure in which an emitter electrode makes a loop around the outside of a collector electrode in order to reduce the mounting area. Similarly, the FWD also has a structure in which an anode electrode makes a loop around the outside of a cathode electrode in order to reduce the mounting area.

As shown in FIG. 12, a portion of a connecting wire that connects the collector electrode of the LIGBT to the cathode electrode of the FWD is arranged extending laterally above an $n^-$-type voltage-resistance maintaining region (also referred to as a "drift region") of the LIGBT and the FWD. Normally, high voltage is applied to the connecting wire that connects the collector electrode to the cathode electrode. Therefore, if this connecting wire is arranged above the voltage-resistance maintaining region, electrons will be induced by the electrical potential of this connecting wire, such that the electron concentration will increase at the surface of this voltage-resistance maintaining portion, and the charge of the voltage-resistance maintaining region will become unbalanced. As a result, the electrical potential distribution of the voltage-resistance region will become uneven, suppressing the depletion layer from extending or expanding during reverse bias, so the voltage resistance will end up decreasing.

In order to solve the problem of the voltage-resistance decreasing due to the connecting wire, the applicant of this application proposed the technology described below in Japanese Patent Application No. 2009-209987 (JP-A-2009-209987).

FIG. 13 is a plan layout view of an example embodiment of a semiconductor device according to JP-A-2009-209987, FIG. 14 is a view of the plan layout of the electrodes of the LIGBT and the FWD shown in FIG. 13.

As shown in FIG. 13, a first trench insulation separating portion 120 makes a loop in a quadrangular shape when a SOI substrate 2000 is viewed from above. A second trench insulation separating portion 140 is provided at a distance from the first trench insulation separating portion 120, and makes a loop in a quadrangular shape around the outside of the first trench insulation separating portion 120 when the SOI substrate 2000 is viewed from above. The first trench insulation separating portion 120 and the second trench insulation separating portion 140 extend parallel to each other, with the exception of at the corners, so the space between the two is constant.

Element regions 160 and 180 sandwiched between the first trench insulation separating portion 120 and the second trench insulation separating portion 140 are adjacent to each other at adjacent portions 110 when the SOI substrate 2000 is viewed from above.

The LIGBT is arranged in the first element region 160, and the FWD is arranged in the second element region 180.

In this semiconductor device, a collector electrode 420 of the LIGBT and a cathode electrode 1420 of the FWD (see FIG. 14) are integrally formed as a single common electrode by being connected together. Therefore, a connecting wire that connects the collector electrode 420 to the cathode electrode 1420 is unnecessary. Furthermore, an emitter electrode 480 of the LIGBT and an anode electrode 1480 of the FWD (see FIG. 14) are also integrally formed as a single common electrode by being connected together. Therefore, a connecting wire to connect the emitter electrode 480 to the anode electrode 1480 is also unnecessary. As a result, these connecting wires will not extend above the drift region of the LIGBT and the FWD. Therefore, with this semiconductor device, a situation in which the electrical potential distribution of the drift region becomes uneven will not occur as it does in the related structure shown in FIGS. 11 and 12. Thus, a decrease in voltage resistance due to connecting wires will not occur in this semiconductor device.

However, there are certain problems with this semiconductor device, which will be described below That is, the LIGBT and the FWD are arranged looping around in overall quadrangular shapes when viewed from above, as shown in FIG. 13. If the LIGBT includes the corners (at two locations in the example shown in FIG. 13) of the quadrangular shape, current will concentrate at these corners. That is, at the corners, the area of the collector portion will be smaller than the area of the emitter portion, so current will concentrate at the collector portion, as shown in FIG. 15, reducing the short circuit capacity. FIG. 15 is a view illustrating the way in which current concentrates at the corners of the LIGBT. Here, the short circuit capacity indicates the time until the semiconductor element fails when high-voltage large-current is applied to a semiconductor element.

Also, as shown in region A encircled by the broken line in FIG. 13, if the region where the LIGBT is continuous is long, the ability of the LIGBT to radiate heat will decrease, so voltage resistance when the element is on will decrease due to the high-temperature LIGBT.

SUMMARY OF THE INVENTION

The invention thus provides a semiconductor device capable of further improving the voltage resistance of a semiconductor device that is capable of suppressing a decrease in voltage resistance due to a connecting wire.

A first aspect of the invention relates to a semiconductor device provided with various different semiconductor elements. This semiconductor device includes a semiconductor layer; a first type of a first semiconductor element that is arranged in a first element region of the semiconductor layer, and that has a first main electrode and a second main electrode, and that is configured so that current flows between the first main electrode and the second main electrode, and that switches the current; and a second type of a second semiconductor element that is arranged in a second element region of the semiconductor layer, and that has a third main electrode and a fourth main electrode, and that is configured so that current flows between the third main electrode and the fourth main electrode, and that freewheels the current. The first element region and the second element region are adjacent to one another in a direction orthogonal to a direction in which the current flows, and are formed in a loop shape over an entire element region that includes the first element region and the second element region, when the semiconductor layer is viewed from above. The first main electrode and the second main electrode are arranged parallel to each other in the loop direction. The third main electrode and the fourth main electrode are arranged parallel to each other in the loop direction. The first main electrode of the first semiconductor element is electrically connected to the third main electrode of the second semiconductor element. The second main electrode of the first semiconductor element is electrically connected to the fourth main electrode of the second semiconductor element. When the semiconductor layer is viewed from above, a ratio of a length of the first main electrode in the loop direction to a length of the second main electrode in the loop direction is larger than a ratio of a length of the third main electrode in the loop direction to a length of the fourth main electrode in the loop direction.

According to this semiconductor device, when the semiconductor layer is viewed from above, the curvature of the first element region is smaller than the curvature of the second element region. Accordingly, current does not tend to concentrate at the first semiconductor element that is arranged in the first element region, so a decrease in the short circuit capacity of the first semiconductor element can be suppressed. As a result, damage to the first semiconductor element that switches the current can be suppressed. In this invention, being electrically connected includes a case in which two electrodes to be connected are integrally formed (i.e., a single electrode functions as two electrodes), a case in which two electrodes to be connected are separate but are connected together, and a case in which two electrodes to be connected are separated from each other and these electrodes are electrically connected together by a wire.

In the semiconductor device described above, when the semiconductor layer is viewed from above, a curvature of a center line between the first main electrode and the second main electrode in the first element region may be smaller than a curvature of a center line between the third main electrode and the fourth main electrode in the second element region.

In the semiconductor device described above, the curvature of the center line between the first main electrode and the second main electrode may be a curvature in which current will not concentrate, or will tend not to concentrate, between the first main electrode and the second main electrode when excessive current flows to the first semiconductor element.

According to this semiconductor device, it is possible to more reliably suppress the current from concentrating.

In the semiconductor device described above, the first semiconductor element and the second semiconductor element may be arranged alternately in the first element region, so that the second semiconductor element that is arranged in the first element region and the second element region is sandwiched in the loop direction from both sides by the first semiconductor element.

According to this semiconductor device, heat generated at the first semiconductor element is released to the second semiconductor element, so the ability of the first semiconductor element to radiate heat can be improved. Accordingly, the first semiconductor element can be prevented from reaching a high temperature, so a decrease in the voltage resistance of the first semiconductor element when the element is on can be suppressed.

In the semiconductor device described above, the element region formed in the loop shape may have a portion of a serpentine shape.

According to this semiconductor device, the area occupied by the element region on the semiconductor layer is able to be increased, thus enabling the semiconductor device to be compact.

In the semiconductor device described above, the second element region may be an arc-shaped portion when the semiconductor layer is viewed from above, and the first element region may be a straight portion when the semiconductor layer is viewed from above.

According to this semiconductor device, the first element region is a straight portion when the semiconductor layer is viewed from above, so current is able to be more reliably suppressed from concentrating at the first semiconductor element.

In the semiconductor device described above, the first semiconductor element may be a lateral insulated gate bipolar transistor, and the second semiconductor element may be a free wheeling diode.

According to this semiconductor device, it is possible to more reliably suppress current from concentrating at the first semiconductor element.

In the semiconductor device described above, the first semiconductor element may be a laterally diffused metal oxide semiconductor, and the second semiconductor element may be a free wheeling diode.

According to this semiconductor device, it is possible to more reliably suppress current from concentrating at the first semiconductor element.

In the semiconductor device described above, the first semiconductor element may be a lateral insulated gate bipolar transistor, and the second semiconductor element may be a laterally diffused metal oxide semiconductor.

According to this semiconductor device, it is possible to more reliably suppress current from concentrating at the first semiconductor element.

With the semiconductor devices described above, it is possible to further improve the voltage resistance characteristics of a semiconductor device that is capable of suppressing a decrease in voltage resistance due to a connecting wire.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

First Example Embodiment

A first example embodiment of the semiconductor device of the invention will now be described with reference to the drawings. Before describing the structure of the semiconductor device according to the first example embodiment, an inverter circuit provided with the semiconductor device will first be described.

Figure 1:
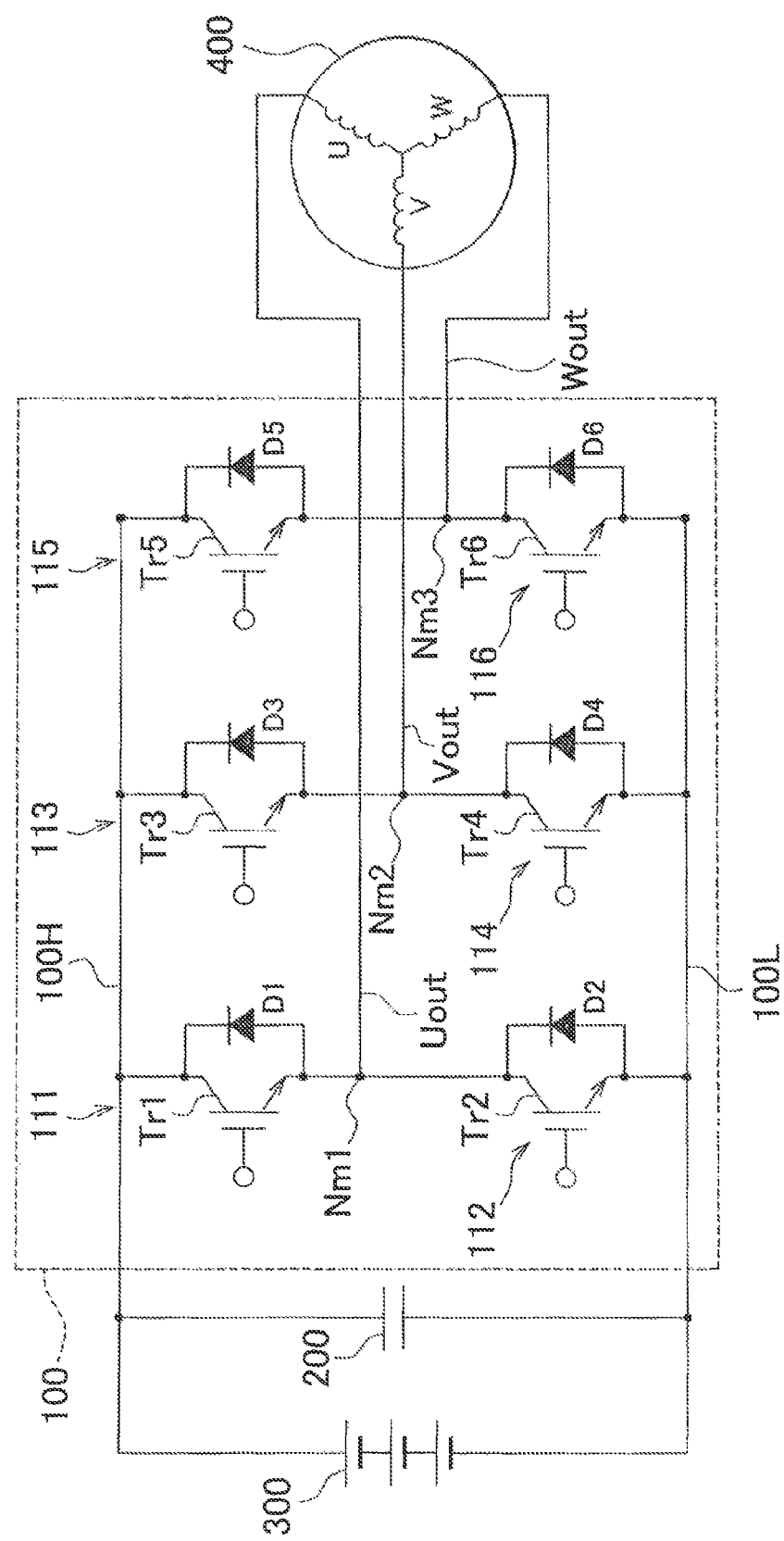
FIG. 1 is a circuit diagram schematically showing an inverter circuit that is incorporated into an inverter module.

FIG. 1 is a circuit diagram schematically showing an inverter circuit 100 that is incorporated into an inverter module. The inverter circuit 100 is provided between a high voltage direct current power supply 300 and a motor 400. This inverter circuit 100 converts direct current (DC) power supplied from the high voltage direct current power supply 300 into alternating current (AC) power, and supplies this AC power to the motor 400. The DC power supplied from the high voltage direct current power supply 300 is typically often stepped up by a converter, and this converter is also often incorporated into the inverter module. A capacitor 200 is provided between the high voltage direct current power supply 300 and the inverter circuit 100 to smooth out the DC power.

As shown in FIG. 1, the inverter circuit 100 includes six semiconductor devices 111 to 116 (i.e., each of which is the semiconductor device according to the first example embodiment. As will be described later, the six semiconductor devices 111 to 116 are provided on a single SOI substrate and formed by a single, chip. It should be noted that the six semiconductor devices 111 to 116 may also be provided on separate SOI substrates. Each semiconductor device 111 to 116 includes a transistor Tr1 to Tr6 that switches the current, and a free wheeling diode (hereinafter referred to as "FWD") D1 to D6 that is connected in parallel with the transistor Tr1 to Tr6. A Lateral IGBT (Lateral Insulated Gate Bipolar Transistor; hereinafter referred to as "LIGBT") is used for each of the transistors Tr1 to Tr6. A gate control signal is applied from an inverter drive circuit, not shown, to a gate of each transistor Tr1 to Tr6.

As shown in FIG. 1, the inverter circuit 100 has a U-phase arm, a V-phase arm, and a W-phase arm that are connected in parallel between a high-voltage wire 100H and a low-voltage wire 100L of the high voltage direct current power supply 300. The U-phase arm is formed by semiconductor devices 111 and 112 that are connected in series via an intermediate node Nm1. The V-phase arm is formed by semiconductor devices 113 and 114 that are connected in series via an intermediate node Nm2. The W-phase arm is formed by semiconductor devices 115 and 116 that are connected in series via an intermediate node Nm3.

The intermediate nodes Nm1 to Nm3 are connected to phase output lines Uout, Vout, and Wout, respectively. Each of these phase output lines Uout, Vout, and Wout is connected to an end of a corresponding phase coil of the three phase motor 400. The other end of each phase coil is connected to a common neutral point. It should be noted that the motor 400 in this example has three phases, but the technology described in this specification does not limit the number of phases, but may be applied to any of various AC electric motors.

Figure 2:
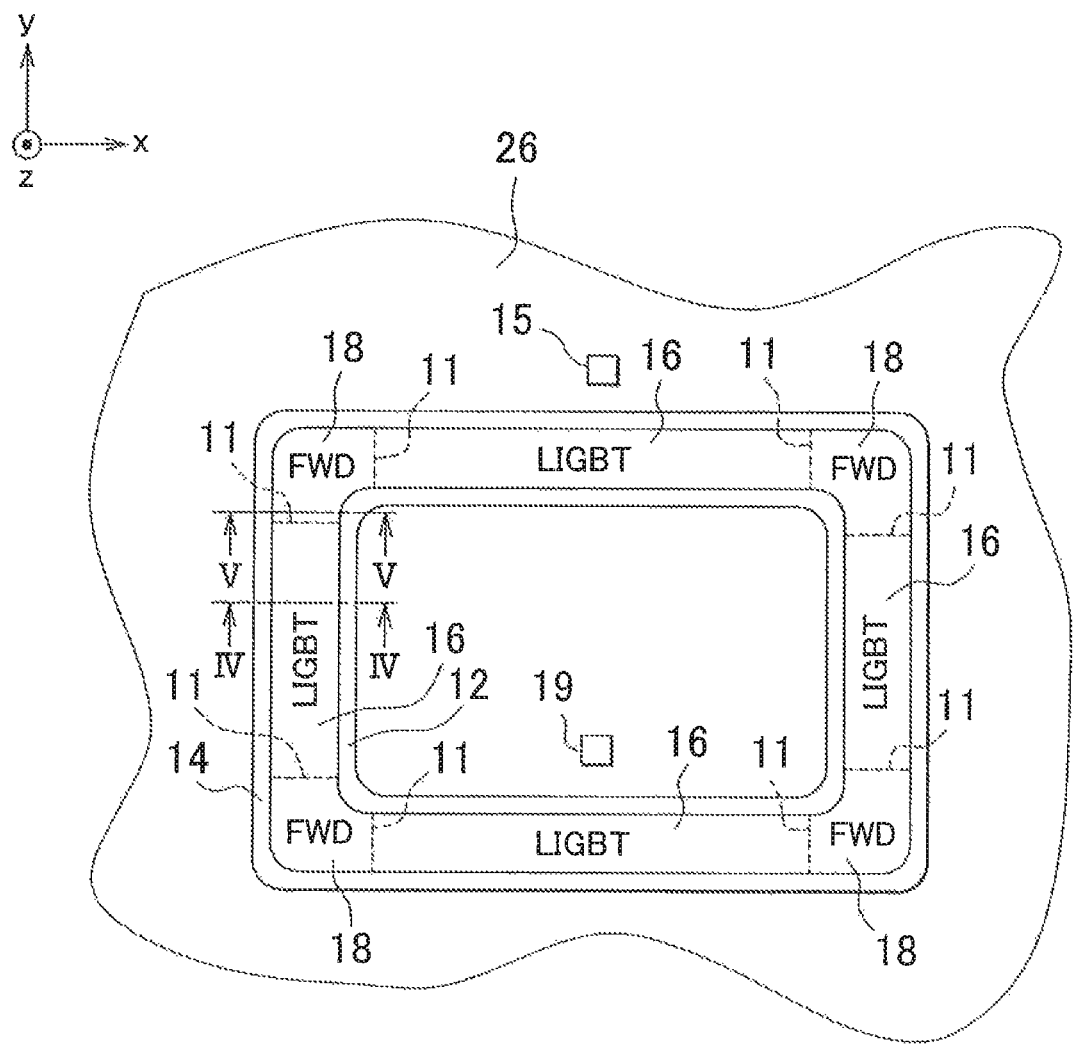
FIG. 2 is a plan view of the layout of a semiconductor device according to a first example embodiment of the invention.
Figure 3:
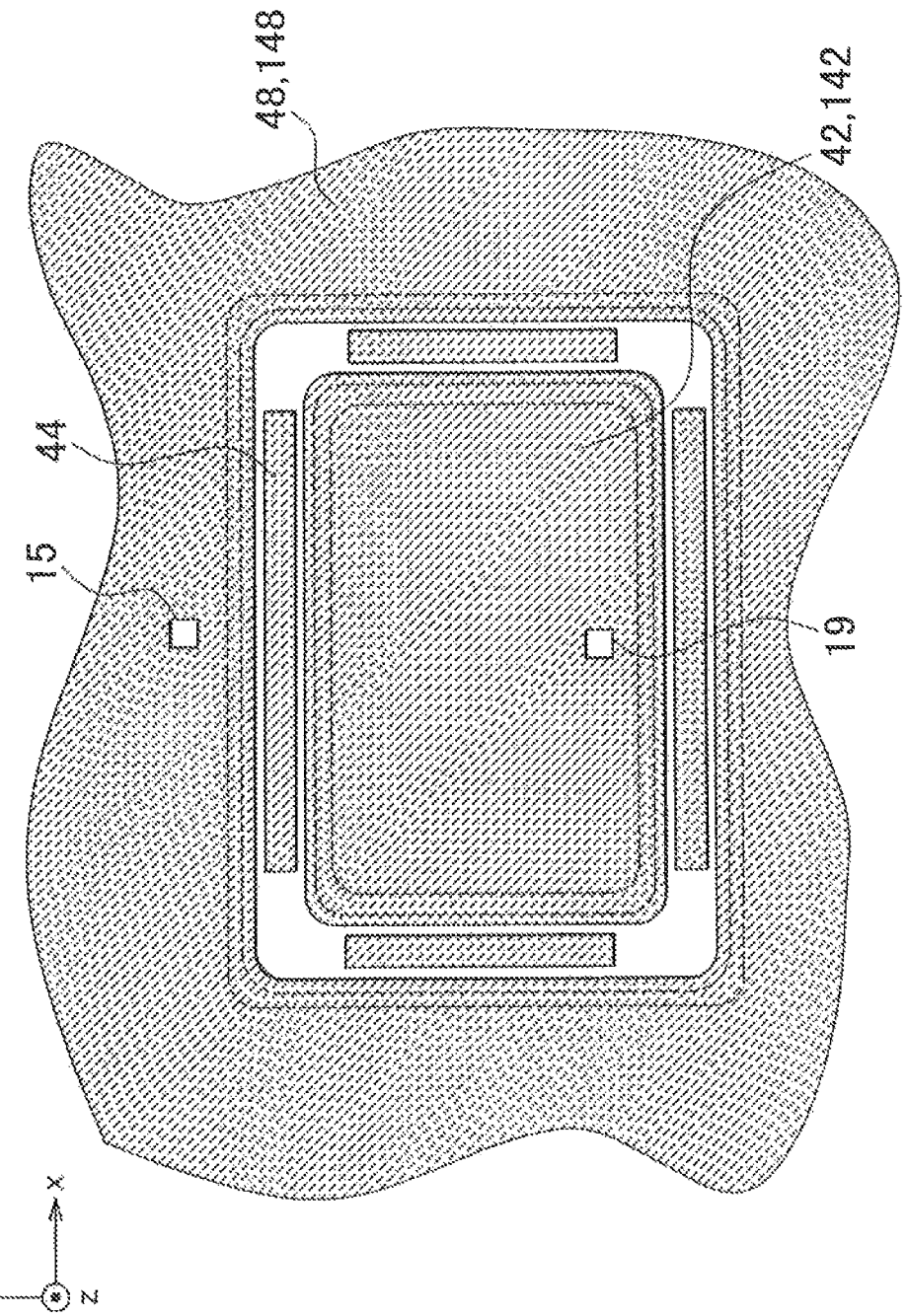
FIG. 3 is a plan view of the layout of electrodes arranged on the semiconductor device according to the first example embodiment, superimposed on FIG. 2.
Figure 4:
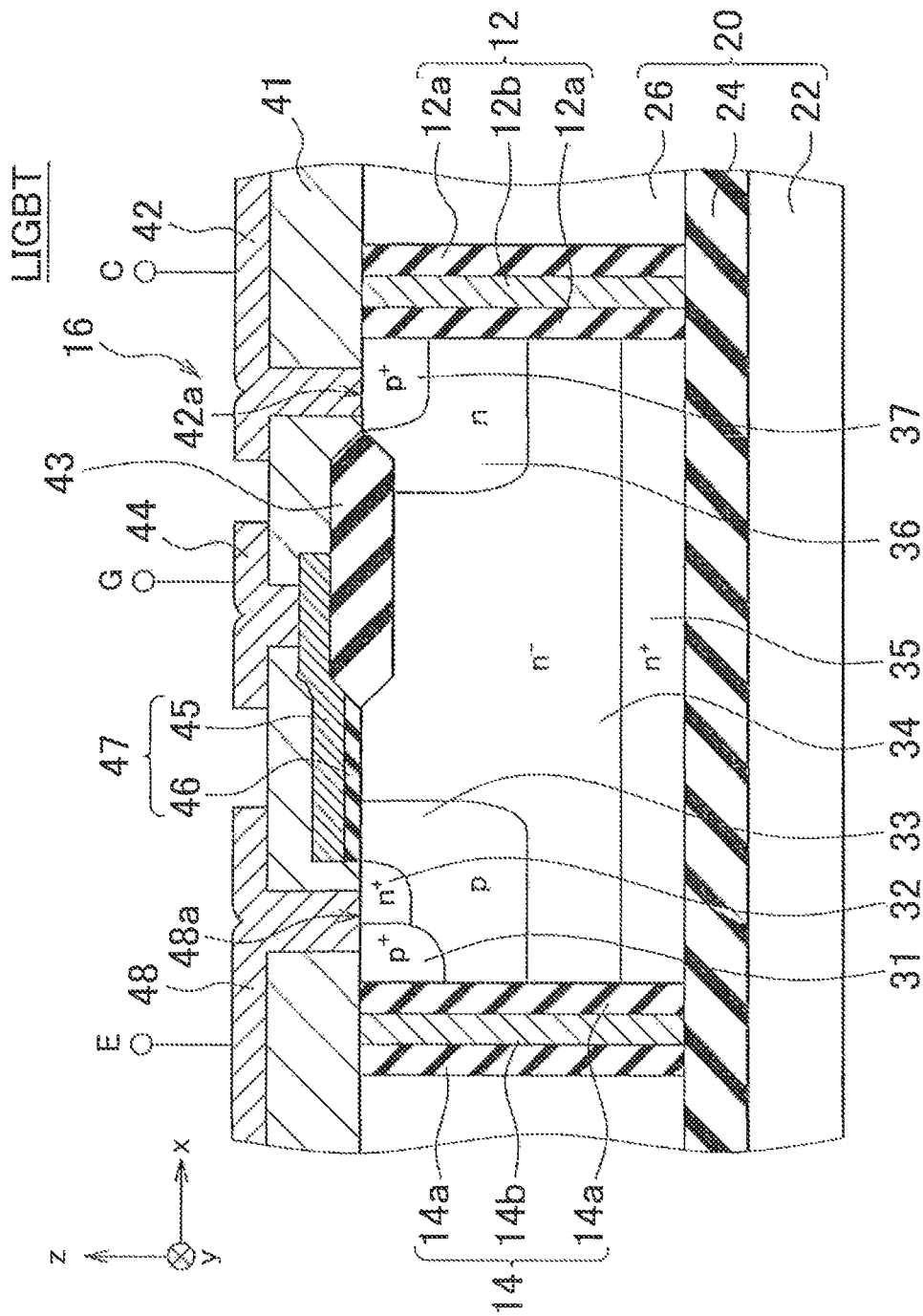
FIG. 4 is a sectional view taken along line IV-IV in FIG. 2, of a LIGBT at an adjacent portion.
Figure 5:
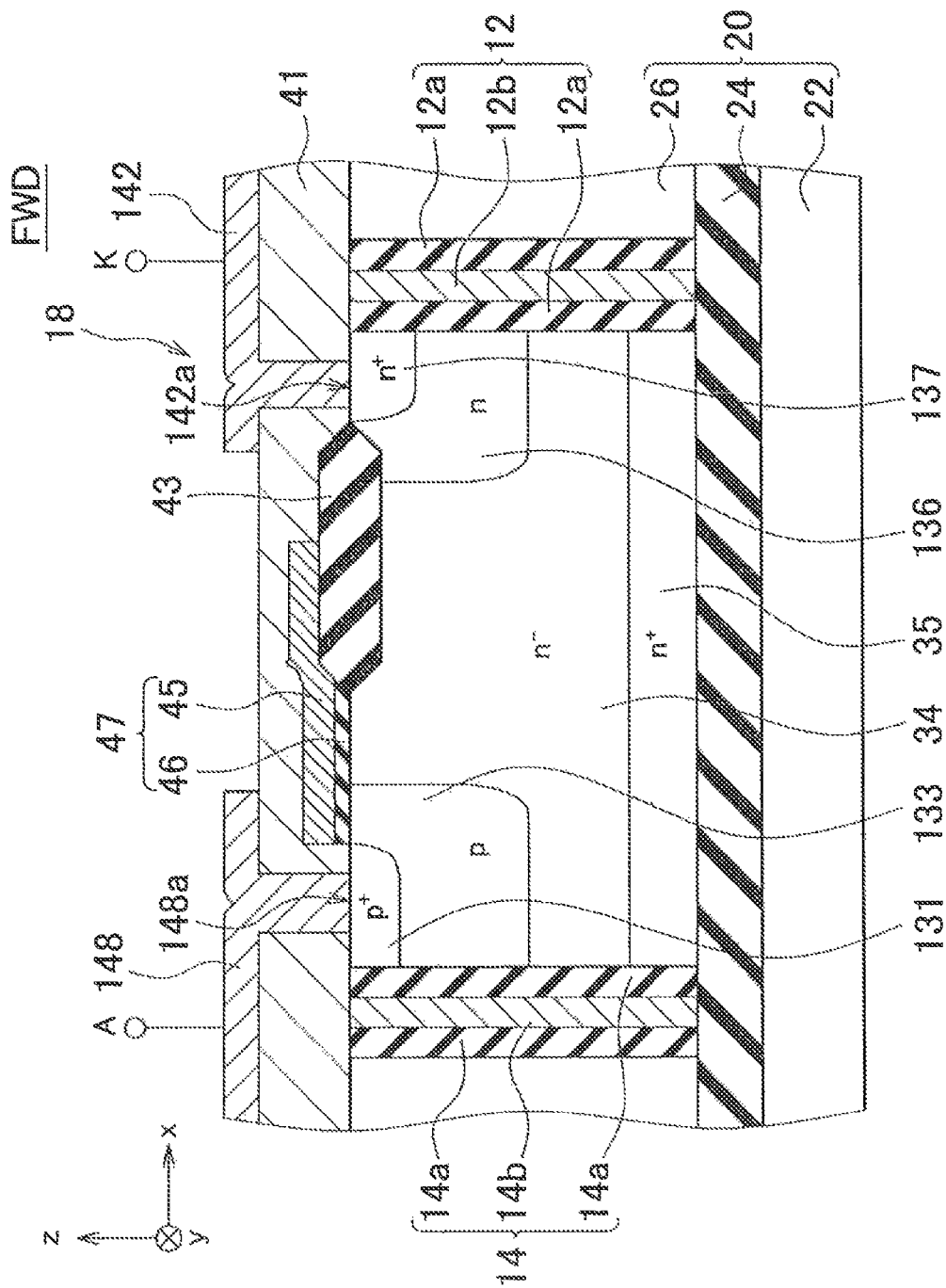
FIG. 5 is a sectional view taken along line V-V in FIG. 2, of a FWD at an adjacent portion.

As described above, each of the six semiconductor devices 111 to 116 is formed by a LIGBT and a FWD, and has the same configuration. Hereinafter, one of the six semiconductor devices 111 to 116 that form the inverter circuit 100 will be described in detail with reference to FIGS. 2 to 5. FIG. 2 is a plan view of the layout of the semiconductor device. FIG. 3 is a plan view of the layout of electrodes arranged on the semiconductor device, superimposed on FIG. 20 FIG. 4 is a sectional view taken along line IV-IV in FIG. 2, of the LIGBT at an adjacent portion. FIG. 5 is a sectional view taken along line V-V in FIG. 2, of the FWD at an adjacent portion.

With an inverter circuit such as that shown in FIG. 1, normally, the LIGBT of the upper arm 111 and the LIGBT of the lower arm 112 are driven alternately, the LIGBT of the upper arm 113 and the LIGBT of the lower arm 114 are driven alternately, and the LIGBT of the upper arm 115 and the LIGBT of the lower arm 116 are driven alternately. However, at the time the driving switches, both are temporarily on, so the high-voltage wire 100H and the low-voltage wire 100L short. If this happens, high voltage will be applied between the emitter and the collector when the LIGBT is on, so excessive current from the short will flow between the emitter and the collector. That is, excessive current will flow, although only momentarily, to the LIGBT during switching (or when current is being converted). On the other hand, the FWD has high resistance from the high-voltage wire 100H side toward the low-voltage wire 100L side, so it is unlikely that excessive current from the short will flow to the FWD.

As shown in FIG. 2, a first trench insulation separating portion 12 and a second trench insulation separating portion 14 that pass through a semiconductor layer 26 of a SOI substrate 20 are provided on the semiconductor layer 26. The first trench insulation separating portion 12 makes a loop when the SOI substrate 20 is viewed from above (or the first trench insulation separating portion 12 formed as a loop on the SOI substrate 20). The second trench insulation separating portion 14 is provided at a distance from the first trench insulation separating portion 12, and makes a loop around the outside of the first trench insulation separating portion 12 when the SOI substrate 20 is viewed from above. The first trench insulation separating portion 12 and the second trench insulation separating portion 14 extend parallel, except for at the corners, so the distance between the first trench insulation separating portion 12 and the second trench insulation separating portion 14 is constant.

Element regions 16 and 18 that are sandwiched between the first trench insulation separating portion 12 and the second trench insulation separating portion 14 are separated from the surrounding semiconductor layer 26. The first element region 16 and the second element region 18 are adjacent to one another in a direction orthogonal to the direction in which current flows (i.e., to the direction from the first trench insulation separating portion 12 side toward the second trench insulation separating portion 14 side), when the semiconductor layer 26 is viewed from above. An element region that includes the first element region 16 and the second element region 18 is formed in an overall shape that loops around. This loop shape is not particularly limited, but in the example shown in FIGS. 2 and 3, it is quadrangular overall, with the four corner portions being arc-shaped portions. When the semiconductor layer is viewed from above, the ratio of the length in the loop direction of a collector electrode to the length in the loop direction of an emitter electrode is larger than the ratio of the length in the loop direction of a cathode electrode to the length in the loop direction of an anode electrode. When the semiconductor layer is viewed from above, the curvature of the first element region 16 is smaller than the curvature of the second element region 18. The curvature of the second element region 18 is a curvature in which it is highly likely that current will concentrate in the second element region 18 when excessive current flows to the semiconductor element (excessive current will essentially not flow to the second element region 18, so no problems will occur). Also, the curvature of the first element region 16 is a curvature in which current will not concentrate between the emitter and the collector, or in which it is unlikely that current will concentrate between emitter and the collector, when the excessive current flows to the semiconductor element. The first element region 16 may also be a straight portion. If the loop-shaped element region is formed by straight portions and arc-shaped portions, for example, as described above, the first element region 16 and the second element region 18 may each be formed by these arc-shaped portions and straight portions.

Next, FIG. 4 is a sectional view of the LIGBT near an adjacent portion 11. As shown in FIG. 4, the SOI substrate 20 has a semiconductor support layer 22, an embedded insulating layer 24, and the semiconductor layer 26. The semiconductor support layer 22 is formed by single-crystal silicon into which n-type or p-type impurities have been introduced in high concentration. The embedded insulating layer 24 is formed by silicon oxide. The semiconductor layer 26 is formed by single-crystal silicon into which n-type impurities have been introduced in low concentration.

As shown in FIG. 4, the LIGBT is formed in the first element region 16 that is sandwiched between the first trench insulation separating portion 12 and the second trench insulation separating portion 14. The first trench insulation separating portion 12 passes through the semiconductor layer 26 all the way to the embedded insulating layer 24, and includes an oxide film 12a of silicon oxide, and a polysilicon core portion 12b that is covered by this oxide film 12a. Similarly, the second trench insulation separating portion 14 also passes through the semiconductor layer 26 all the way to the embedded insulating layer 24, and includes an oxide film 14a of silicon oxide, and a polysilicon core portion 14b that is covered by this oxide film 14a.

As shown in FIG. 4, the LIGBT includes a $p^+$-type body contact region 31, an $n^+$-type emitter region 32, a p-type body region 33, an $n^-$-type drift region 34, a $n^+$-type embedded region 35, an n-type buffer region 36, and a $p^+$-type collector region 37.

The body contact region 31, the emitter region 32, and the body region 33 are provided on the second trench insulation separating portion 14 side of the surface layer portion of the semiconductor layer 26. More specifically, the body contact region 31 and the body region 33 contact the side surface of the second trench insulation separating portion 14. The emitter region 32 is separated from the drift region 34 by the body region 33. The drift region 34 is provided between the body region 33 and the buffer region 36, and is a region that maintains the electrical potential difference when the LIGBT is off. The embedded region 35 is provided on the back layer portion of the semiconductor layer 26, and extends from the first trench insulation separating portion 12 to the second trench insulation separating portion 14. The buffer region 36 and the collector region 37 are provided on the side surface of the first trench insulation separating portion 12 of the surface layer portion of the semiconductor layer 26. More specifically, the buffer region 36 and the collector region 37 contact the side surface of the first trench insulation separating portion 12. The collector region 37 is separated from the drift region 34 by the buffer region 36. These sectional structures are common across the entire first element region 16. Therefore, the body contact region 31, the emitter region 32, and the body region 33 are provided across the entire first element region 16 along the side surface of the second trench insulation separating portion 14 when the SOI substrate 20 is viewed from above. Similarly, the buffer region 36 and the collector region 37 are provided across the entire first element region 16 along the side surface of the first trench insulation separating portion 12 when the SOI substrate 20 is viewed from above.

As shown in FIG. 4, the LIGBT also includes an interlayer insulating film 41, a collector electrode 42 (a first main electrode), a Local Oxidation of Silicon (LOCOS) oxide film 43, a gate electrode 44, a planar gate portion 47, and an emitter electrode 48 (a second main electrode).

The interlayer insulating film 41 covers the surface of the SOI substrate 20 and is formed by silicon oxide. The collector electrode 42 is arranged on the surface of the interlayer insulating film 41 on the first trench insulation separating portion 12 side. More specifically, the collector electrode 42 is also arranged above the first trench insulation separating portion 12. The collector electrode 42 is arranged at least above the first trench insulation separating portion 12 and along the first trench insulation separating portion 12 when the SOI substrate 20 is viewed from above. Furthermore, a portion of the collector electrode 42 extends through the interlayer insulating film 41 and contacts the collector region 37 at a contact portion 42a of the collector electrode 42. The contact portion 42a is provided across the entire first element region 16 along the first trench insulation separating portion 12 when the SOI substrate 20 is viewed from above. Also, the collector electrode 42 is preferably not arranged beyond the buffer region 36 in the direction from the first trench insulation separating portion 12 toward the second trench insulation separating portion 14 (i.e., toward the left in FIG. 4), when the SOI substrate 20 is viewed from above.

The LOCOS oxide film 43 is provided on the surface of the drift region 34 and is formed of silicon oxide. The gate electrode 44 is arranged on the surface of the interlayer insulating film 41 between the collector electrode 42 and the emitter electrode 48. A portion of the gate electrode 44 extends through the interlayer insulating film 41 and contacts the planar gate portion 47. The planar gate portion 47 includes a planar electrode 45 and a gate insulating film 46, and faces the surface of the body region 33 that separates the emitter region 32 from the drift region 34. The planar electrode 45 covers a portion of the surface of the LOCOS oxide film 43 and the surface of the gate insulating film 46, and is formed of polysilicon into which impurities have been introduced in high concentration. The gate insulating film 46 is formed of silicon oxide.

The emitter electrode 48 is arranged on the surface of the interlayer insulating film 41 on the second trench insulation separating portion 14 side. More specifically, the emitter electrode 48 is also arranged above the second trench insulation separating portion 14. The emitter electrode 48 is arranged at least above the second trench insulation separating portion 14 and along the second trench insulation separating portion 14 when the SOI substrate 20 is viewed from above. Furthermore, a portion of the emitter electrode 48 extends through the interlayer insulating film 41 and contacts the body contact region 31 and the emitter region 32 at a contact portion 48a of the emitter electrode 48. The contact portion 48a is provided across the entire first element region 16 along the second trench insulation separating portion 14 when the SOI substrate 20 is viewed from above. At the adjacent portion 11, the collector electrode 42 and the emitter electrode 48 are arranged with a space in between each another in the direction of the x axis, and the gate electrode 44 is arranged in this space.

As shown in FIG. 5, the FWD has several structures in common with the LIGBT. Hereinafter, only the structures that differ from those of the LIGBT will be described. Common structures will be denoted by like reference characters and descriptions of these structures will be omitted. The FWD differs from the LIGBT in that it includes a p$^+$-type anode contact region 131, a p-type anode region 133, an n-type cathode region 136, an n$^+$-type cathode contact region 137, a cathode electrode 142 (a third main electrode), and an anode electrode 148 (a fourth main electrode).

The anode contact region 131 and the anode region 133 are provided on the second trench insulation separating portion 14 side in the surface layer portion of the semiconductor layer 26. More specifically, the anode contact region 131 and the anode region 133 contact the side surface of the second trench insulation separating portion 14. The anode region 133 is manufactured by the same manufacturing process as the body region 33 of the LIGBT, and has the same dopant, concentration, and diffusion depth as the body region 33. The cathode region 136 and the cathode contact region 137 are provided on the first trench insulation separating portion 12 side in the surface layer portion of the semiconductor layer 26. More specifically, the cathode region 136 and the cathode contact region 137 contact the side surface of the first trench insulation separating portion 12. Also, the cathode region 136 is manufactured by the same manufacturing process as the buffer region 36 of the LIGBT, and has the same dopant, concentration, and diffusion depth as the buffer region 36. These sectional structures are common across the entire second element region 18. Therefore, the anode contact region 131 and the anode region 133 are provided across the entire second element region 18 along the side surface of the second trench insulation separating portion 14 when the SOI substrate 20 is viewed from above. Similarly, the cathode region 136 and the cathode contact region 137 are provided across the entire second element region 18 along the side surface of the first trench insulation separating portion 12 when the SOI substrate 20 is viewed from above.

Also, the body region 33 of the LIGBT and the anode region 133 of the FWD contact one another at the adjacent portions 11 shown in FIG. 2. Therefore, the p-type regions 33 and 133 loop around inside of the element regions 16 and 18 along the side surface of the second trench insulation separating portion 14 when the SOI substrate 20 is viewed froth above. Furthermore, the buffer region 36 of the LIGBT and the cathode region 136 of the FWD also contact one another at the adjacent portions 11 shown in FIG. 2. Therefore, the n-type regions 36 and 136 also loop around within the element regions 16 and 18 along the side surface of the first trench insulation separating portion 12 when the SOI substrate 20 is viewed from above.

The cathode electrode 142 is arranged on the surface of the interlayer insulating film 41 on the first trench insulation separating portion 12 side. More specifically, the cathode electrode 142 is also arranged above the first trench insulation separating portion 12. The cathode electrode 142 is arranged at least above the first trench insulation separating portion 12 and along the first trench insulation separating portion 12 when the SOI substrate 20 is viewed from above. Furthermore, a portion of the cathode electrode 142 extends through the interlayer insulating film 41 and contacts the cathode contact region 137 via a contact portion 142a. The contact portion 142a is provided across the entire second element region 18 along the first trench insulation separating portion 12 when the SOI substrate 20 is viewed from above. Also, the cathode electrode 142 is preferably not arranged beyond the cathode region 136 in the direction from the first trench insulation separating portion 12 toward the second trench insulation separating portion 14 (i.e., toward the left in FIG. 5) when viewed from above.

The anode electrode 148 is arranged on the surface of the interlayer insulating film 41 on the second trench insulation separating portion 14 side. More specifically, the anode electrode 148 is also arranged above the second trench insulation separating portion 14. The anode electrode 148 is arranged at least above the second trench insulation separating portion 14 and along the second trench insulation separating portion 14 when the SOI substrate 20 is viewed from above. Furthermore, a portion of the anode electrode 148 extends through the interlayer insulating film 41 and contacts the anode contact region 131 via a contact portion 148a. The contact portion 148a is provided across the entire second element region 18 along the second trench insulation separating portion 14 when the SOI substrate 20 is viewed from above. A portion of the anode electrode 148 also preferably extends through the interlayer insulating film 41 and contacts the planar electrode 45. Furthermore, the anode electrode 148 is preferably not arranged beyond the planar electrode 45 in the direction from the second trench insulation separating portion 14 toward the first trench insulation separating portion 12 (i.e., toward the right in FIG. 5) when viewed from above. At the adjacent portion 11, the cathode electrode 142 and the anode electrode 148 are arranged with a space in between each another in the direction of the x axis in FIG. 5.

Also, the contact portion 48a of the emitter electrode 48 of the LIGBT and the contact portion 148a of the anode electrode 148 of the FWD contact one another at the adjacent portions 11 shown in FIG. 2. Therefore, these contact portions 48a and 148a loop around along the second trench insulation separating portion 14 when the SOI substrate 20 is viewed from above. Furthermore, the contact portion 42a of the collector electrode 42 of the LIGBT and the contact portion 142a of the cathode electrode 142 of the FWD contact one another at the adjacent portions 11 shown in FIG. 2. Therefore, these contact portions 42a and 142a loop around along the first trench insulation separating portion 12 when the SOI substrate 20 is viewed from above.

The collector electrode 42, the gate electrode 44, and the emitter electrode 48 of the LIGBT, and the cathode electrode 142 and the anode electrode 148 of the FWD are manufactured by the same manufacturing process using vapor deposition technology. Aluminum is used for the material of these electrodes. As shown in FIG. 3, the collector electrode 42 of the LIGBT and the cathode electrode 142 of the FWD are provided in an area to the inside of the first trench insulation separating portion 12 when viewed from above. That is, the collector electrode 42 of the LIGBT and the cathode electrode 142 of the FWD are a single common electrode. A collector—cathode bonding pad 19 is provided on this single common electrode. Also, the emitter electrode 48 of the LIGBT and the anode electrode 148 of the FWD are provided in an area to the outside of the second trench insulation separating portion 14. That is, the emitter electrode 48 of the LIGBT and the anode electrode 148 of the FWD are also a single common electrode. An emitter—anode bonding pad 15 is provided on this single common electrode.

According to this example embodiment, the curvature of the first element region 16 is smaller than the curvature of the second element region 18 when the semiconductor layer 26 is viewed from above. Therefore, current does not tend to concentrate at the LIGBT (a first semiconductor element), so a decrease in the short circuit capacity of the LIGBT (the first semiconductor element) can be suppressed. As a result, damage to the LIGBT (the first semiconductor element) that switches the current can be suppressed.

Also, with the semiconductor device according to this example embodiment, the collector electrode 42 of the LIGBT and the cathode electrode 142 of the FWD are formed as a single common electrode, so a connecting wire to connect the collector electrode 42 to the cathode electrode 142 is not necessary. Moreover, the emitter electrode 48 of the LIGBT and the anode electrode 148 of the FWD are also formed as a single common electrode, so a connecting wire to connect the emitter electrode 48 to the anode electrode 148 is also not necessary. Therefore, these connecting wires do not extend above the drift region 34 of the FWD and the LIGBT. Accordingly, with the semiconductor device of this example embodiment, a situation in which the electrical potential distribution of the drift region is uneven that occurs with the related structure shown in FIG. 10 and FIG. 11 will not occur.

Also, as shown in FIG. 3, with the semiconductor device according to this example embodiment, the common electrode of the collector electrode 42 of the LIGBT and the cathode electrode 142 of the FWD is arranged on the inside, and the common electrode of the emitter electrode 48 of the LIGBT and the anode electrode 148 of the FWD is arranged around the common electrode of the both electrodes 42 and 142 so as to surround the common electrode of the both electrodes 42 and 142. As shown in FIG. 1, the collector electrode 42 of the LIGBT and the cathode electrode 142 of the FWD are connected to the high voltage side of the high voltage direct current power supply 300, and the emitter electrode 48 of the LIGBT and the anode electrode 148 of the FWD are connected to the low voltage side of the high voltage direct current power supply 300. That is, with the semiconductor device according to this example embodiment, the common electrode on the low voltage side is arranged surrounding the common electrode on the high voltage side. As described above, the inverter circuit in this example embodiment is such that the semiconductor devices 111 to 116 shown in FIG. 1 are provided on the single SOI substrate 20. Therefore, arranging the common electrode on the low voltage side enables voltage differences between the plurality of semiconductor devices to be kept small.

Figure 6:
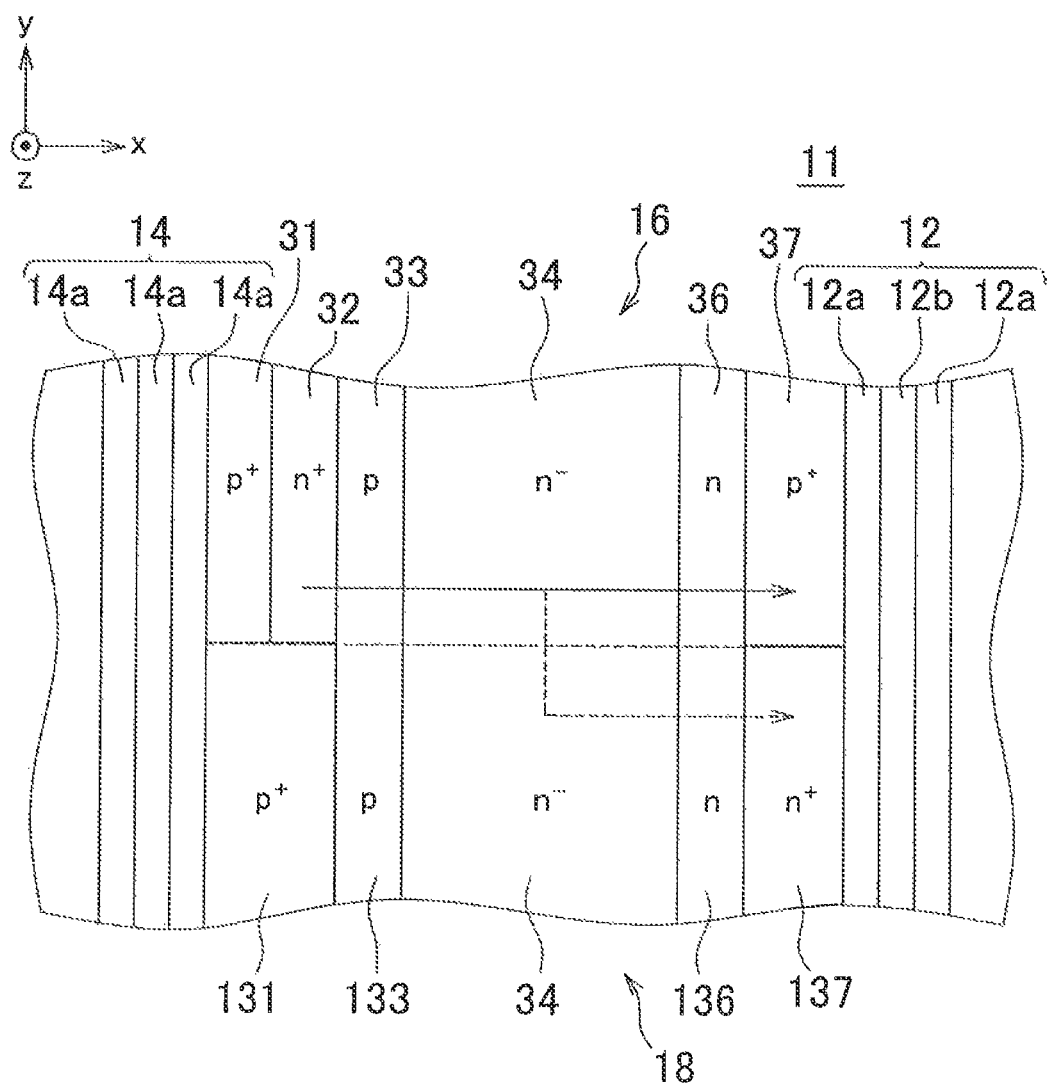
FIG. 6 is an enlarged plan view of an adjacent portion Where a first element region and a second element region are adjacent to one another in the first example embodiment.

Furthermore, FIG. 6 is an enlarged plan view of the adjacent portion 11 where the first element region 16 and the second element region 18 are adjacent to one another. As shown in FIG. 6, when the LIGBT and the FWD are provided adjacent to one another, there is a parasitic MOS formed by the 32, the body region 33, and the drift region 34 of the LIGBT, and the cathode region 136 of the FWD. However, with the semiconductor device according to this example embodiment, the area of the adjacent portion 11 where the LIGBT and the FWD contact one another is small compared with the total area of the LIGBT and the FWD when the semiconductor layer is viewed from above. Therefore, when the LIGBT is on, a phenomenon in which the parasitic MOS operates, as shown by the broken arrow in FIG. 6, does not pose any particular problem. As a result, with the semiconductor device according to this example embodiment, when the LIGBT is on, the LIGBT operation becomes dominant, so low voltage is able to be obtained.

Figure 7:
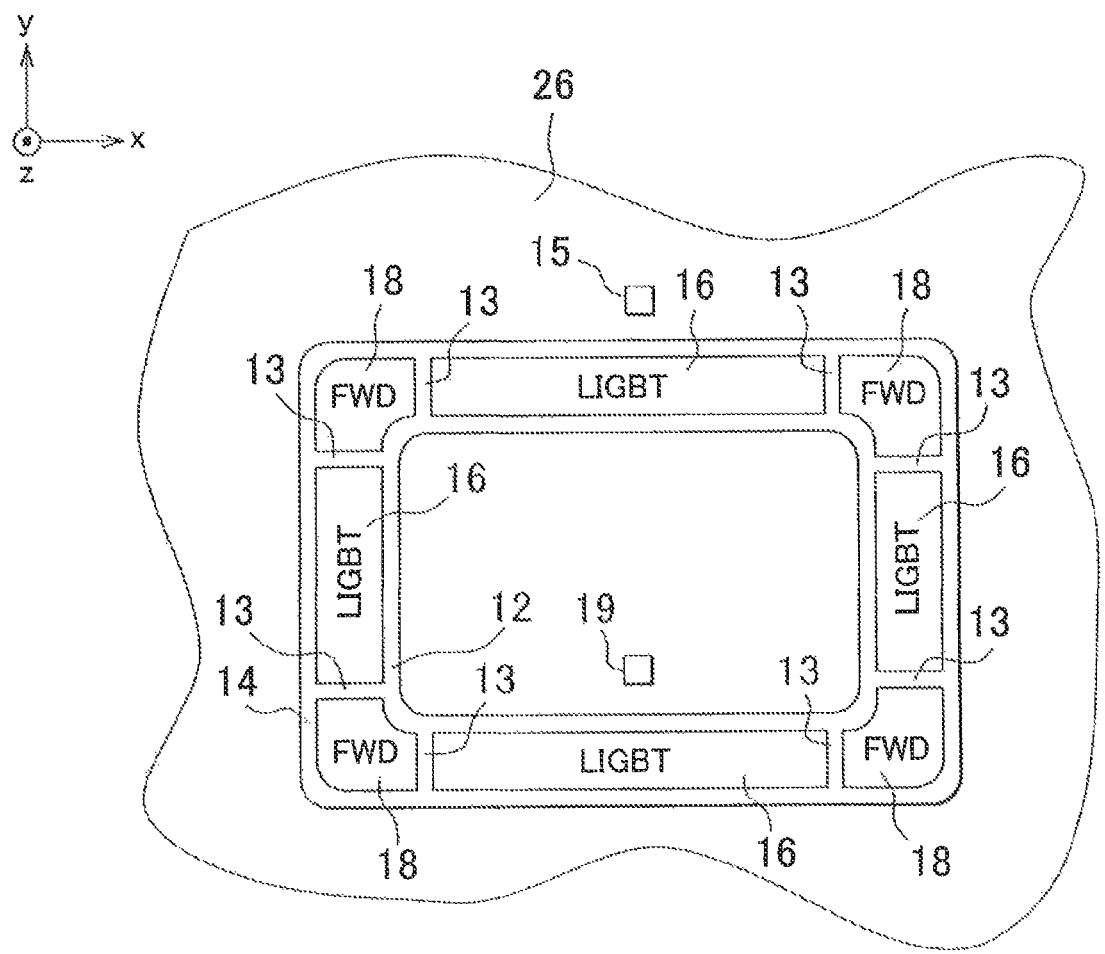
FIG. 7 is a plan view of the layout of a modified example of the semiconductor device according to the first example embodiment.
Figure 8:
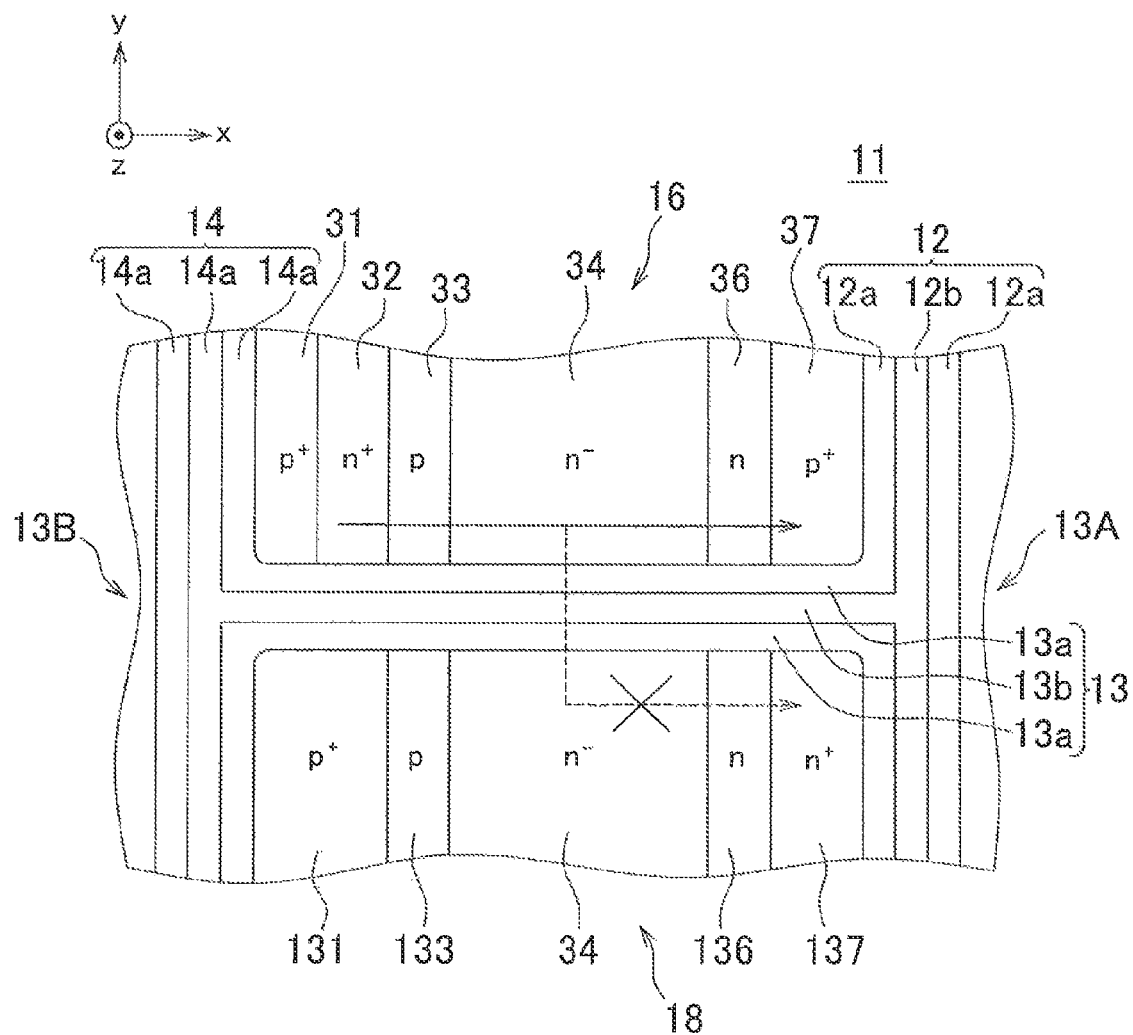
FIG. 8 is an enlarged plan view of the adjacent portion where the first element region and the second element region are adjacent to one another in the modified example shown in FIG. 7.

As shown in FIGS. 7 and 8, the semiconductor device according to this example embodiment is also preferably provided with a third trench insulation separating portion 13. A first end portion 13A of this third trench insulation separating portion 13 contacts the first trench insulation separating portion 12, and a second end portion 13B of the third trench insulation separating portion 13 contacts the second trench insulation separating portion 14. The first element region 16 and the second element region 18 are separated by this third trench insulation separating portion 13. When the third trench insulation separating portion 13 is provided, electrons are prevented from flowing from the LIGBT to the FWD. As a result, when the LIGBT is on, the phenomenon in which the parasitic MOS operates is able to be completely prevented.

Second Example Embodiment

Figure 9:
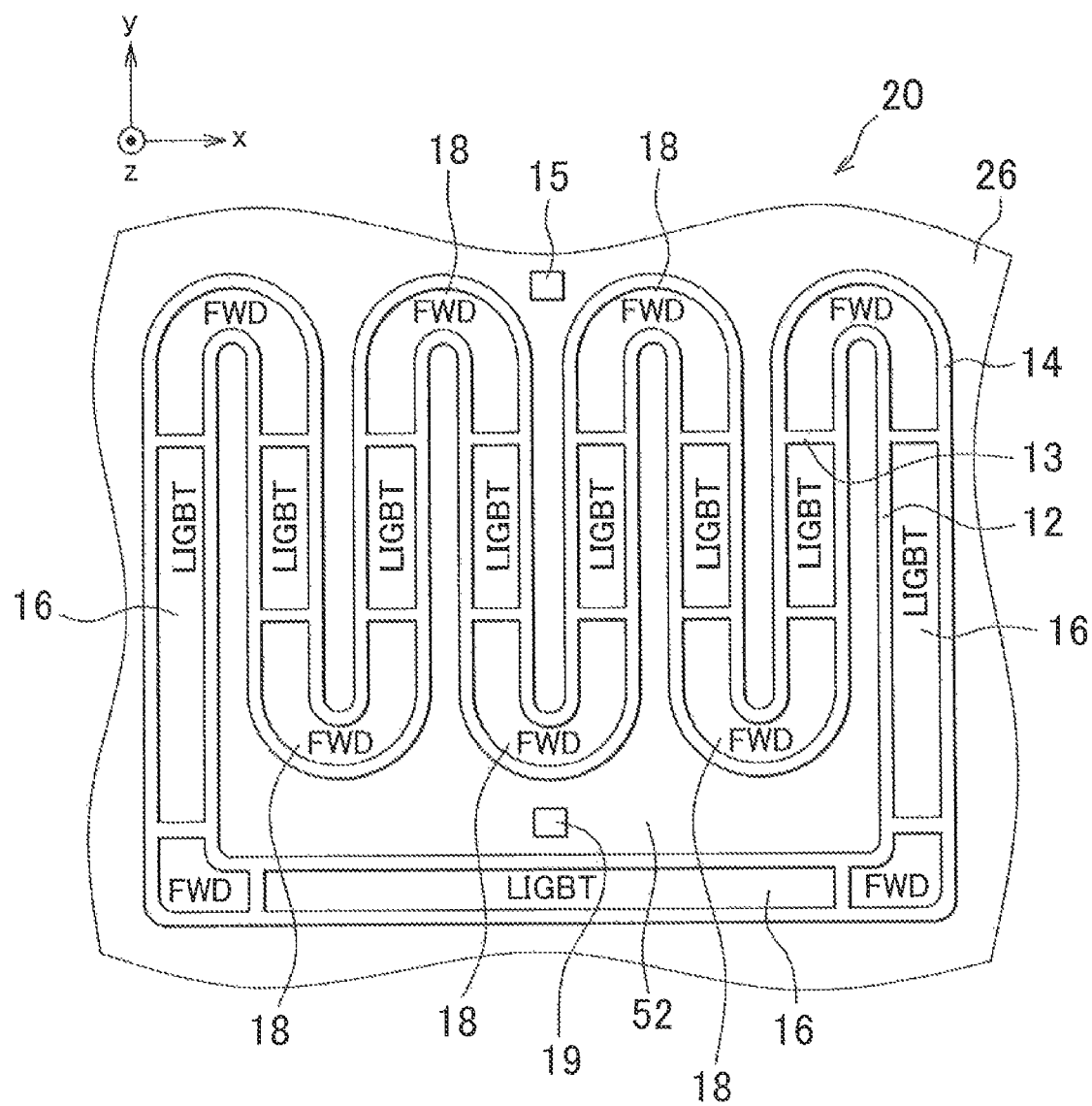
FIG. 9 is a plan view of the layout of a semiconductor device according to a second example embodiment of the invention.

FIG. 9 is a plan view of the layout of a semiconductor device according to a second example embodiment of the invention. Structural elements common to the semiconductor device according to the first example embodiment will be denoted by like reference characters and descriptions of these elements will be omitted. With the semiconductor device according to this second example embodiment, a portion of the element regions 16 and 18 that are sandwiched between the first trench insulation separating portion 12 and the second trench insulation separating portion 14 is formed in a shape that winds back and forth at least twice (or serpentine shape, in this example, the portion winds back and forth four times in the y-axis direction) when the SOI substrate 20 is viewed from above. In other words, a portion 52 of the semiconductor layer 26 surrounded by the first trench insulation separating portion 12 can also have a comb shape when the SOI substrate 20 is viewed from above. This enables the area occupied by the element regions 16 and 18 on the semiconductor layer 26 to be increased, thus enabling the mounting area to be kept small.

Third Example Embodiment

Figure 10:
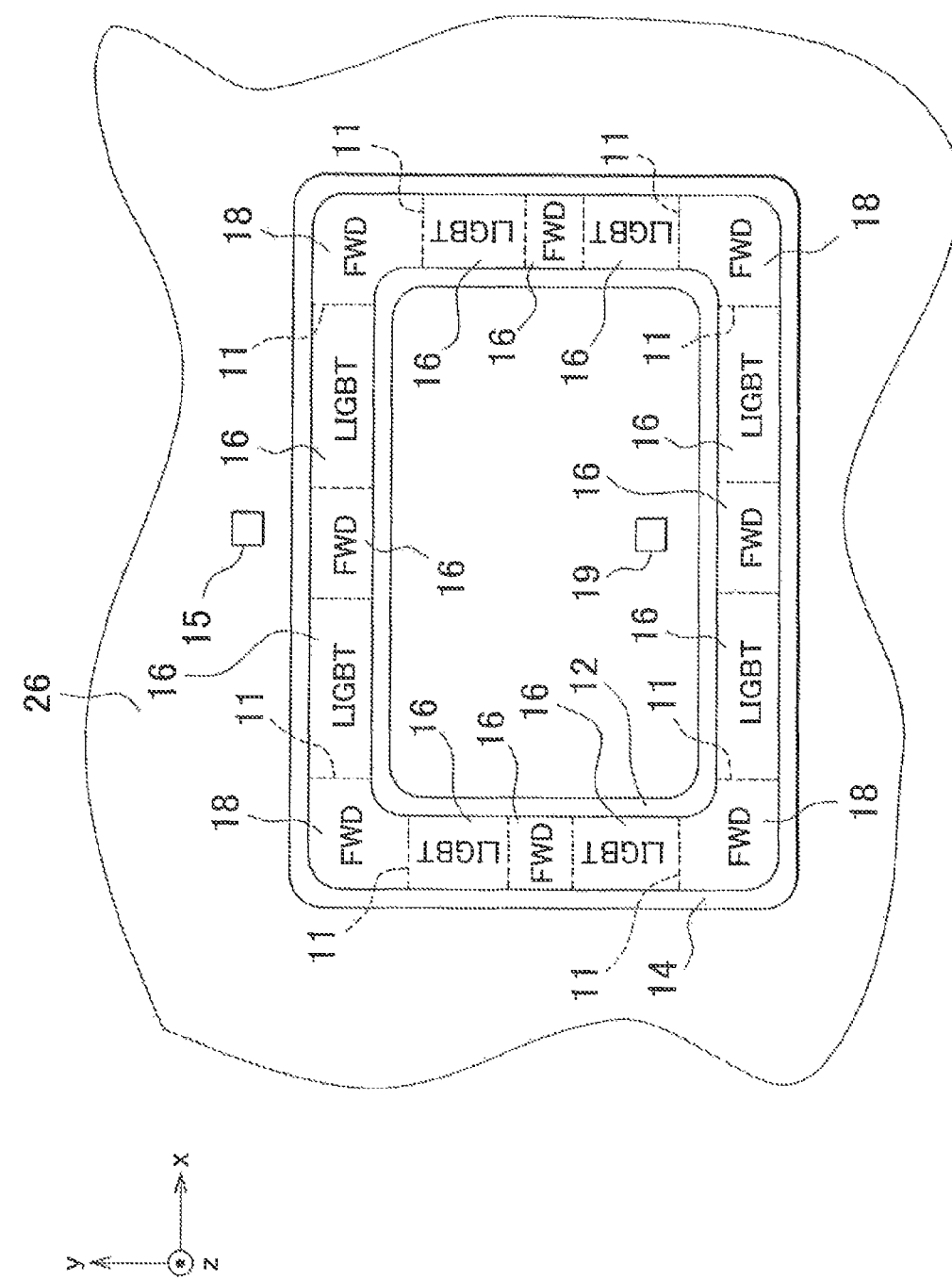
FIG. 10 is a view of the plan layout of a semiconductor device according to a third example embodiment of the invention.
Figure 11:
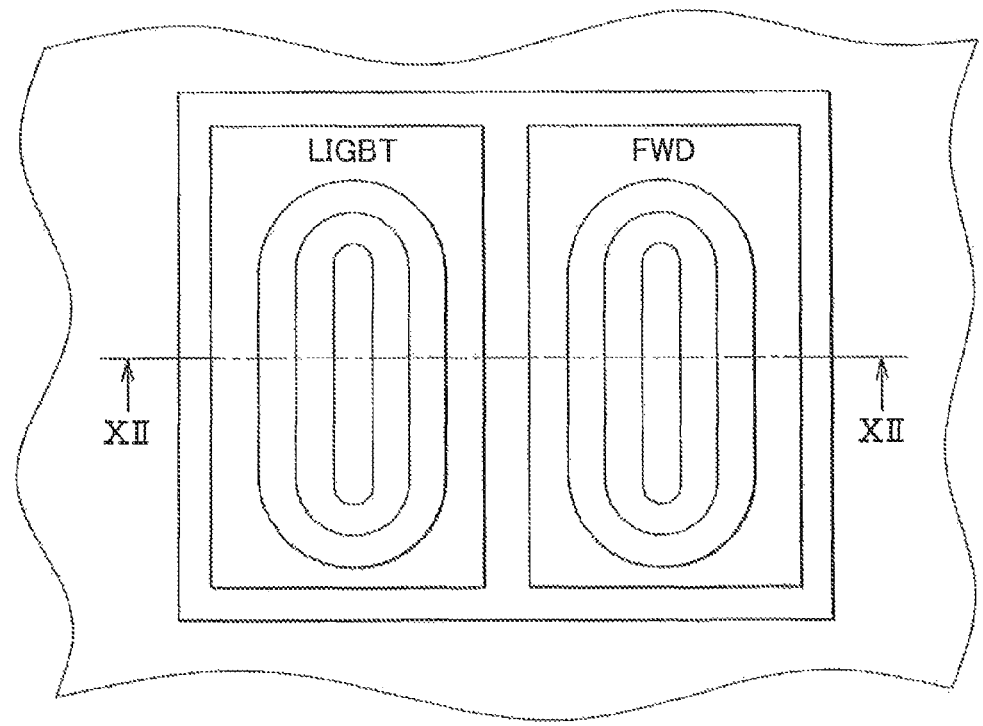
FIG. 11 is a view of the plan layout of a semiconductor device according to related art.
Figure 12:
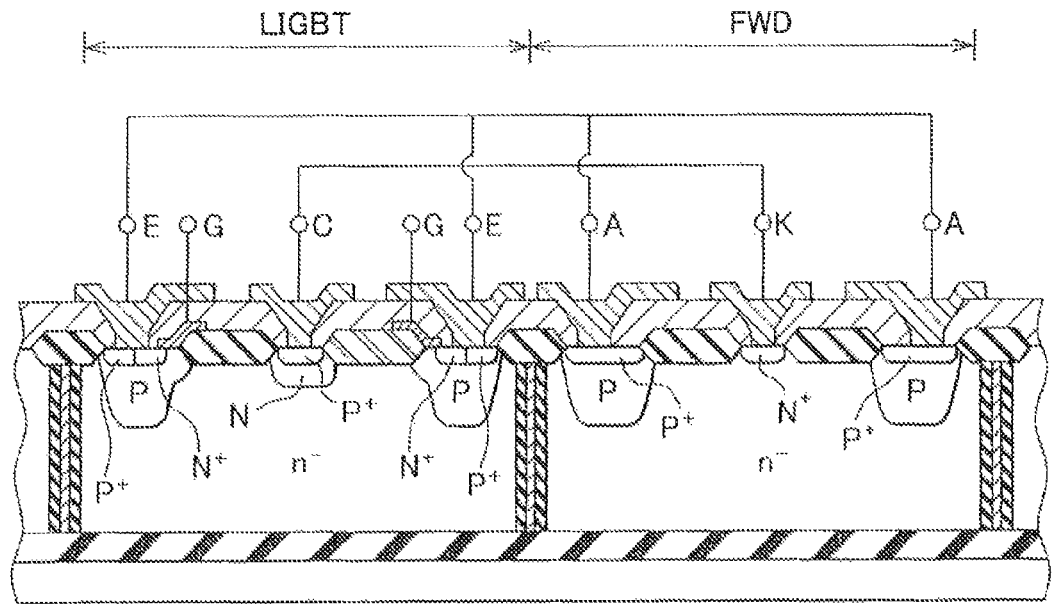
FIG. 12 is a sectional view taken along line XI-XI in FIG. 11.
Figure 13:
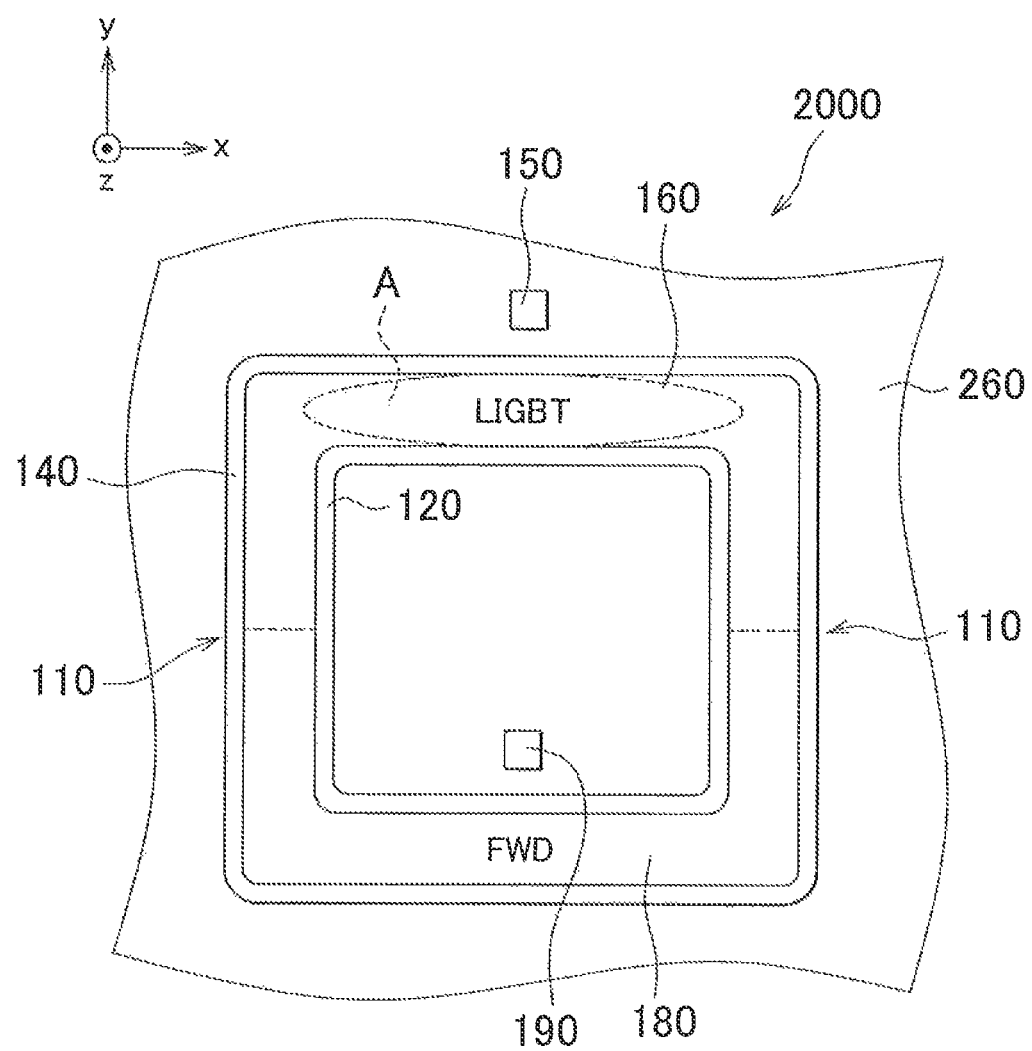
FIG. 13 is a plan layout view of an example embodiment of a semiconductor device according to JP-A-2009-209987.
Figure 14:
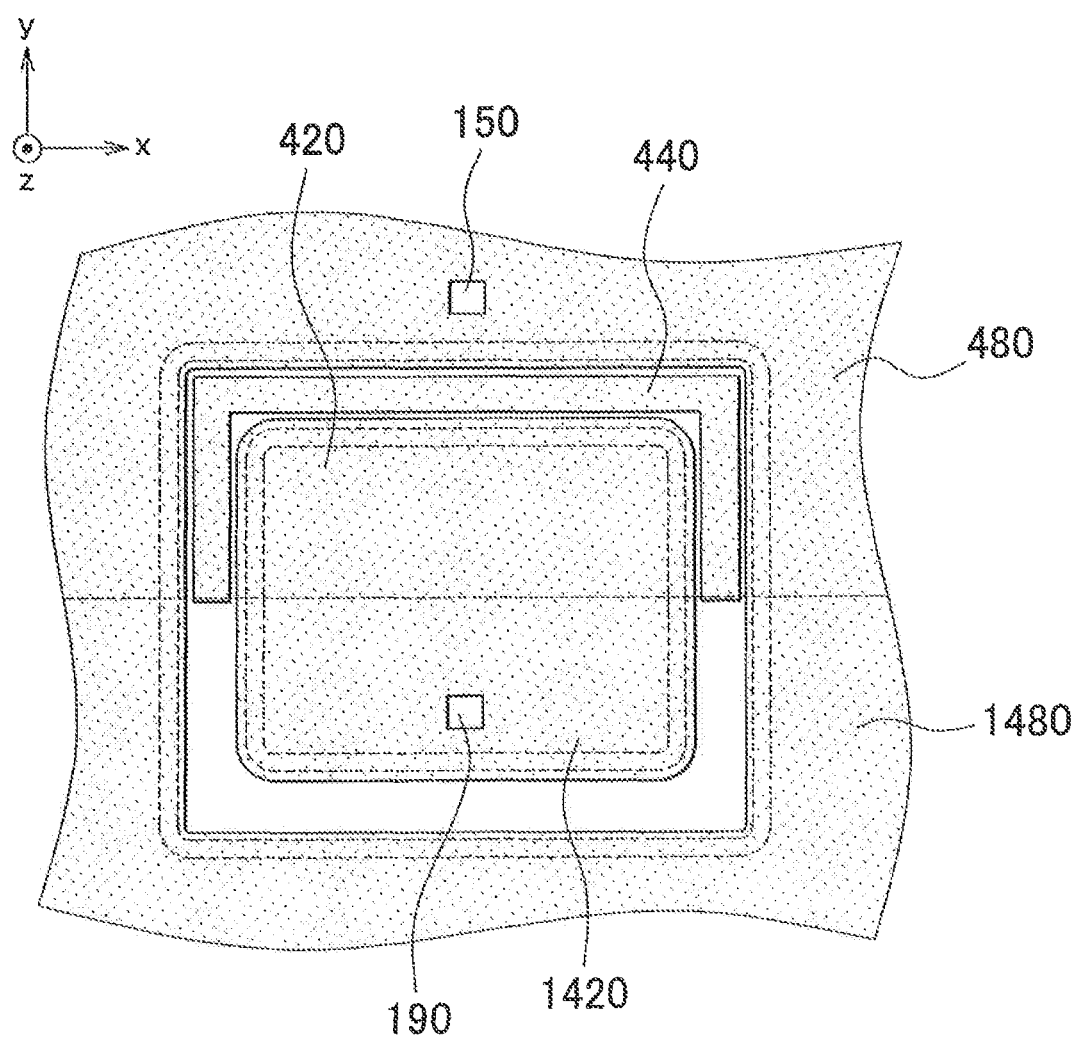
FIG. 14 is a view of a plan layout of the electrodes of the LIGBT and FWD shown in FIG. 13.
Figure 15:
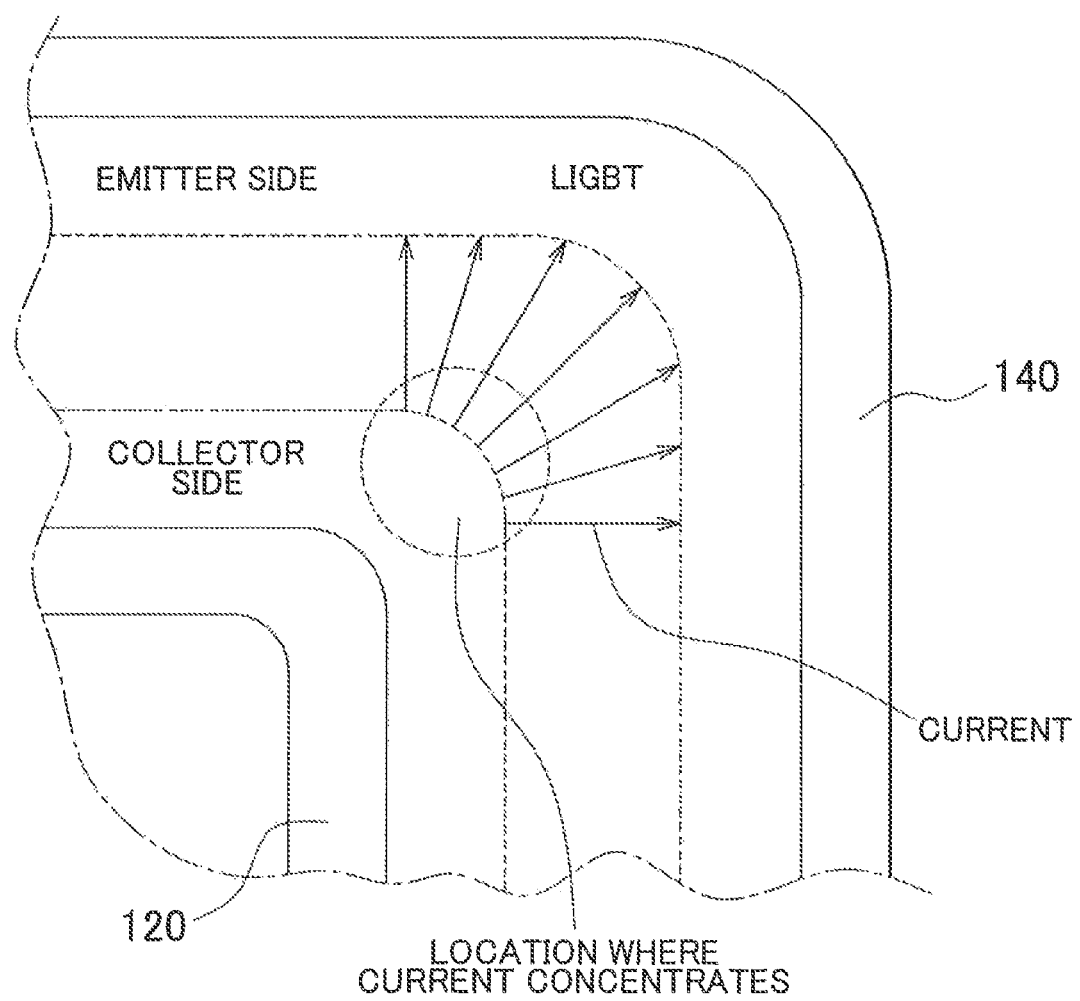
FIG. 15 is a view showing current concentrating at a corner of the LIGBT.

FIG. 10 is a plan view of the layout of a semiconductor device according to a third example embodiment of the invention. Structural elements common to the semiconductor device according to the first example embodiment will be denoted by like reference characters and descriptions of these elements will be omitted. With the semiconductor device according to this third example embodiment, the LIGBT (the first semiconductor element) and the FWD (the second semiconductor element) that is arranged not only in the second element region 18 but also in the first element region 16 (a straight portion in this example), are alternately arranged in the first element region 16 such that the FWD is sandwiched by the LIGBT from both sides, in the loop-shaped element region that is sandwiched between the first trench insulation separating portion 12 and the second trench insulation separating portion 14. In this example embodiment, two LIGBTs and one FWD are arranged in each straight portion. It should be noted that the number of LIGBTs and FWDs is not particularly limited as long as an FWD (a second semiconductor element) is sandwiched from both sides by LIGBTs (first semiconductor elements) at a portion where the curvature is relatively small.

According to this third example embodiment, heat generated at the LIGBT (the first semiconductor element) is radiated to the FWD (the second semiconductor element), so the ability of the LIGBT to radiate heat can be improved. Accordingly, the LIGBT can be prevented from reaching a high temperature, so a decrease in the voltage resistance when the element is on can be suppressed.

While the invention has been described with reference to specific embodiments thereof, these example embodiments are for illustrative purposes only, and do not limit the scope of claims. Various modifications and the like of the example embodiments described above are included in the technology described within the scope of the claims for patent. For example, in the example embodiments described above, the first semiconductor element is a LIGBT and the second semiconductor element is a FWD. However, the first semiconductor element may also be a Laterally Diffused Metal Oxide Semiconductor (LDMOS), and the second semiconductor element may be a FWD, or the first semiconductor element may be a LIGBT and the second semiconductor element may be a LDMOS. Also, in the example embodiments described above, silicon is used for the semiconductor material of the SDI substrate. Instead, however, other semiconductor material may be used. For example, a composite semiconductor of gallium nitride, silicon carbide, or gallium arsenide or the like, may be used, for example. Also, the technological elements illustrated in this specification or the drawings display technological usefulness either alone or in combination, and are not limited by the combination of the original claims. Also, the technology illustrated in this specification or the drawings is able to simultaneously realize a plurality of objects, but is technologically useful in its own right by realizing one of these objects.

The invention may be used for a semiconductor device or the like in which a plurality of various different semiconductor elements are provided on a single semiconductor layer.

The invention claimed is:

1. A semiconductor device provided with a plurality of semiconductor elements, comprising:

a semiconductor layer including a loop-shaped element region having a loop shape when viewing from above the semiconductor layer, the loop-shaped element region including:
  a first element region provided at a corner portion of the loop-shaped element region; and
  a second element region provided at a non-corner portion of the loop-shaped element region, the second element region being arranged adjacent to the first element region in a direction orthogonal to a direction in which current flows;
 a first semiconductor element that arranged in the first element region, the first semiconductor element including:
  a first main electrode portion;
  a second main electrode portion arranged parallel to the first main electrode portion in a loop direction of the loop-shaped element region;
  an interlayer insulating film; and
  a gate electrode arranged on a surface of the interlayer insulating film between the first main electrode portion and the second main electrode portion,
  wherein the first semiconductor element is configured:
   such that current flows between the first main electrode portion and the second main electrode portion, and to switch the current; and
 a second semiconductor element arranged in the second element region, the second semiconductor element including:
  a third main electrode portion; and
  a fourth main electrode portion arranged parallel to the third main electrode portion in the loop direction,
  wherein the second semiconductor element includes a free wheeling diode and is configured such that current flows between the third main electrode portion and the fourth main electrode portion,
 wherein:
  the first main electrode portion and the third main electrode portion are electrically connected to each other and constitute a first single common electrode;
  the second main electrode portion and the fourth main electrode are electrically connected to each other and constitute a second single common electrode; and
  when viewing from above the semiconductor layer, a ratio of a length of the first main electrode portion in the loop direction to a length of the second main electrode portion in the loop direction is larger than a ratio of a length of the third main electrode portion in the loop direction to a length of the fourth main electrode portion in the loop direction.

2. The semiconductor device according to claim 1, wherein when viewing from above the semiconductor layer, a curvature of a center line between the first main electrode portion and the second main electrode portion is smaller than a curvature of a center line between the third main electrode portion and the fourth main electrode portion.

3. The semiconductor device according to claim 1, wherein a curvature of a center line between the first main electrode portion and the second main electrode portion is configured such that current does not or does not tend to concentrate between the first main electrode portion and the second main electrode portion when excessive current flows to the first semiconductor element.

4. The semiconductor device according to claim 1, wherein the first semiconductor element and the second semiconductor element are arranged alternately in the first element region, so that the second semiconductor element that is arranged in the first element region and the second element region is sandwiched in the loop direction from both sides by the first semiconductor element.

5. The semiconductor device according to claim 1, wherein the loop-shaped element region has a portion of a serpentine shape.

6. The semiconductor device according to claim 1, wherein, when viewing from above the semiconductor layer, the second element region has an arc shape and the first element region has a straight shape.

7. The semiconductor device according to claim 1, wherein the first semiconductor element includes a lateral insulated gate bipolar transistor.

8. The semiconductor device according to claim 1, wherein the first semiconductor element includes a laterally diffused metal oxide semiconductor.

9. A semiconductor device provided with a plurality of semiconductor elements, comprising:
   a semiconductor layer including a loop-shaped element region having a loop shape when viewing from above the semiconductor layer, the loop-shaped element region including:
      a first element region provided at a corner portion of the loop-shaped element region; and
      a second element region provided at a non-corner portion of the loop-shaped element region, the second element region being arranged adjacent to the first element region in a direction orthogonal to a direction in which current flows;
   a first semiconductor element arranged in the first element region, the first semiconductor element including:
      a first main electrode portion;
      a second main electrode portion arranged parallel to the first main electrode portion in a loop direction of the loop-shaped element region;
      an interlayer insulating film; and
      a gate electrode arranged on a surface of the interlayer insulating film between the first main electrode portion and the second main electrode portion,
      wherein the first semiconductor element includes a lateral insulated gate bipolar transistor and is configured:
         such that current flows between the first main electrode portion and the second main electrode portion, and
         to switch the current; and
   a second semiconductor element arranged in the second element region, the second semiconductor element including:
      a third main electrode portion; and
      a fourth main electrode portion arranged parallel to the third main electrode portion in the loop direction,
      wherein the second semiconductor element includes a laterally diffused metal oxide semiconductor and is configured such that current flows between the third main electrode portion and the fourth main electrode portion, wherein:
   the first main electrode portion and the third main electrode portion are electrically connected to each other and constitute a first single common electrode;
   the second main electrode portion and the fourth main electrode portion are electrically connected to each other and constitute a second single common electrode; and
   when viewing from above the semiconductor layer, a ratio of a length of the first main electrode portion in the loop direction to a length of the second main electrode portion in the loop direction is larger than a ratio of a length of the third main electrode portion in the loop direction to a length of the fourth main electrode portion in the loop direction.

* * * * *